United States Patent [19]
Miller et al.

[11] Patent Number: 5,380,623
[45] Date of Patent: Jan. 10, 1995

[54] AQUEOUS DEVELOPER FOR LITHOGRAPHIC PRINTING PLATES WHICH PROVIDES IMPROVED OLEOPHILICITY

[75] Inventors: Gary R. Miller; Paul R. West, both of Fort Collins; Melanie A. Felker, Loveland, all of Colo.

[73] Assignee: Eastman Kodak Company, Rochester, N.Y.

[21] Appl. No.: 992,949

[22] Filed: Dec. 17, 1992

[51] Int. Cl.$^6$ .................................................. G03F 7/32
[52] U.S. Cl. .................................... 430/331; 430/302; 430/309; 430/325
[58] Field of Search ............... 430/331, 309, 302, 325; 252/525, 535, 539, 139

[56] References Cited

U.S. PATENT DOCUMENTS

| | | |
|---|---|---|
| 3,701,657 | 10/1972 | Moore et al. |
| 3,707,373 | 12/1972 | Martinson et al. |
| 4,186,006 | 1/1980 | Kobayashi et al. ............ 430/302 |
| 4,308,340 | 12/1981 | Walls ............................ 430/331 |
| 4,350,756 | 9/1982 | Burch et al. ................... 430/331 |
| 4,395,480 | 7/1983 | Sprintschnik ................. 430/309 |
| 4,716,098 | 12/1987 | Mack et al. ................... 430/331 |
| 4,851,324 | 7/1989 | Hsieh ............................. 430/309 |
| 5,035,982 | 7/1991 | Walls ............................. 430/331 |
| 5,106,724 | 4/1992 | Nogami et al. ............... 430/331 |

FOREIGN PATENT DOCUMENTS

| | | |
|---|---|---|
| 0080042 | 6/1983 | European Pat. Off. |
| 1515174 | 6/1978 | United Kingdom. |
| 2110401 | 6/1983 | United Kingdom. |
| 91/01513 | 2/1991 | WIPO ........................... 430/331 |

*Primary Examiner*—Janis L. Dote
*Attorney, Agent, or Firm*—Alfred P. Lorenzo

[57] ABSTRACT

Aqueous alkaline developing compositions useful in the development of negative-working lithographic printing plates are comprised of an organic solvent, an anionic surface active agent, an alkali metal tetraborate, an aliphatic monocarboxylic acid, an aliphatic dicarboxylic acid, a long chain aliphatic amine and sufficient alkaline buffering system to provide an alkaline pH. The developing composition is resistant to oxidation, highly effective in dissolution-type processing, able to effectively desensitize the background areas of the printing plate, and effective in enhancing the oleophilicity of the image areas of the printing plate.

28 Claims, No Drawings

AQUEOUS DEVELOPER FOR LITHOGRAPHIC PRINTING PLATES WHICH PROVIDES IMPROVED OLEOPHILICITY

CROSS-REFERENCE TO RELATED APPLICATIONS

Photosensitive compositions and lithographic printing plates which are especially advantageous for use with the aqueous developer of this invention are disclosed and claimed in copending commonly assigned U.S. patent application Ser. No. 918,868, filed Jul. 23, 1992, "Photosensitive Compositions And Lithographic Printing Plates With Reduced Propensity To Blinding" by John E. Walls and issued Jan. 4, 1994, as U.S. Pat. No. 5,275,907.

An improved aqueous developer, for use with negative-working lithographic printing plates, which has enhanced desensitizing capability is disclosed and claimed in copending commonly assigned U.S. patent application Ser. No. 918,988, filed Jul. 23, 1992, "Aqueous Developer For Lithographic Printing Plates With Improved Desensitizing Capability" by John E. Walls, Gary R. Miller and Raymond W. Ryan, Jr. and issued Jan. 18, 1994, as U.S. Pat. No. 5,279,927.

An improved aqueous developer, for use with negative-working lithographic printing plates, which provides reduced sludge formation, faster processing and a cleaner processing machine, is disclosed and claimed in copending commonly assigned U.S. patent application Ser. No. 992-212, filed Dec. 17, 1992 "Aqueous Developer for Lithographic Printing Plates Which Exhibits Reduced Sludge Formation" by Gary R. Miller, John E. Walls and Melanie A. Felker.

1. Field of the Invention

This invention relates in general to lithography and in particular to a developing composition for developing lithographic printing plates and similar photographic elements. More specifically, this invention relates to a novel aqueous developer for removing the non-image area of negative-working lithographic printing plates.

2. Background of the Invention

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced; such as paper, cloth and the like. Commonly the ink is transferred to an intermediate material called the blanket which in turn transfers the ink to the surface of the material upon which the image is to be reproduced.

The most common type of lithographic printing plate to which the present invention is directed has a light-sensitive coating applied to an aluminum base support. The coating may respond to light by having the portion which is exposed become soluble so that it is removed in the developing process. Such a plate is referred to as positive-working. Conversely, when that portion of the coating which is exposed becomes hardened the plate is referred to as negative-working. In both instances the image area remaining is ink-receptive or oleophilic and the non-image area or background is water-receptive or hydrophilic. The differentiation between image and non-image areas is made in the exposure process where a film is applied to the plate with a vacuum to insure good contact. The plate is then exposed to a light source, a portion of which is composed of UV radiation. In the instance where a positive plate is used, the area on the film that corresponds to the image on the plate is opaque so that no light will strike the plate, whereas the area on the film that corresponds to the non-image area is clear and permits the transmission of light to the coating which then becomes more soluble and is removed. In the case of a negative plate the converse is true. The area on the film corresponding to the image area is clear while the non-image area is opaque. The coating under the clear area of film is hardened by the action of light while the area not struck by light is removed. The light-hardened surface of a negative plate is therefore oleophilic and will accept ink while the non-image area which has had the coating removed through the action of a developer is desensitized and is therefore hydrophilic.

The present invention provides a novel aqueous developer for negative-working lithographic printing plates. Most developer compositions for negative-working printing plates disadvantageously consist primarily of organic solvents which are offensive through their volatility and high concentration, pose toxic exposure hazards to the end user and are pollutants to the environment when evaporated into the air and/or discharged into public waterways. Presently there is a trend toward the use of aqueous developers. Typically, these aqueous developers also contain organic solvents at concentrations which are still environmentally harmful and toxic to the end user. The prime advantage is that the solvents are not odor-wise offensive. They have the disadvantage of having a strongly alkaline pH, cause redeposit on the plate and machine parts, and solubilize the coating residue which creates disposal problems and reduces the effective life of the developer in a processing machine. The present invention provides a composition which substantially alleviates these problems.

Aqueous alkaline developing compositions, for use with negative-working lithographic printing plates, which contain an organic solvent and a surface active agent are well known. Such developing compositions are described for example in U.S. Pat. Nos. 3,701,657, 3,707,373, 4,186,006, 4,308,340, 4,350,756, 4,395,480, 4,716,098, 5,035,982, European Patent No. 0 080 042, British Patent No. 1,515,174 and British Patent No. 2,110,401. As disclosed in U.S. Pat. Nos. 3,701,657, 3,707,373, 4,350,756, 4,395,480 and 4,716,098 it is also known to incorporate in such developing compositions an aliphatic carboxylic acid or salt thereof. Such developers are generally quite effective but suffer from disadvantages which have hindered their commercial utilization, for example, they may not be able to adequately desensitize residual coating which remains in the background areas of the printing plate.

One of the more serious problems which can afflict negative-working lithographic printing plates is inability of the developer to remove all residual coating from the non-image areas of the plate. When sufficient residual coating remains, a condition exists for background sensitivity to occur during the printing process. Minimally, the effect would be to increase the amount of water required in the fountain solution. Under more severe conditions, ink may adhere to the background and ultimately to the printed sheet, thereby resulting in a condition known as "tinting" or "toning." Under extremely severe conditions, there is so much ink in the background that it is referred to as "scumming."

Among the requirements for an effective developer are (1) that it be resistant to oxidation, (2) that it be capable of dissolution-type processing, i.e., that the photosensitive composition dissolves fully in the developing solution rather than breaking up in the form of particles, and (3) that it be effective in desensitizing the non-image areas.

A particularly advantageous negative-working lithographic printing plate is that described and claimed in copending commonly assigned U.S. patent application Ser. No. 918,868, filed Jul. 23, 1992, "Photosensitive Compositions And Lithographic Printing Plates With Reduced Propensity To Blinding" by John E. Walls and issued Jan. 4, 1994, as U.S. Pat. No. 5,275,907. This plate comprises an imaging layer containing a diazo resin, an acid-substituted ternary acetal polymer and an unsaturated polyester. One of its major advantages is its ability to resist blinding. As is well understood in the art, the term "blinding" refers to inability of the image areas to adequately take up the printing ink. In the printing plates of the aforesaid U.S. patent application Ser. No. 918,868, an important feature contributing to the ability to resist blinding is the presence of the unsaturated polyester. However, these plates sometimes exhibit a yellow stain. The use of the unsaturated polyester is, in part, connected with the stain. There appear to be other, as yet poorly understood, factors contributing to the stain. The yellow stain is known to be an extremely thin but strongly adhering layer of diazo resin and polymeric binder which is not removed in the developing process when conventional developers are used. The intensity of the stain is proportional to the amount of residual coating.

In the design of lithographic printing plates, it is often desirable to provide an image that is resistant to press cleaning chemicals and solvents as well as to insure the longest run length possible. In order to provide these benefits, high molecular weight polymers that are resistant to solvent attack and premature wear can be employed. However, such polymers are often very difficult to completely remove from the non-image areas of the printing plate and such plates can be susceptible to background sensitivity. Polymers can be designed that provide improved developability in alkaline developing solutions by incorporation of acidic solubilizing groups into or onto the polymer backbone. Unfortunately, these acidic functional groups tend to provide unwanted hydrophilicity to the image areas of the plate and thus to cause blinding.

An improved aqueous developer which has enchanced desensitizing capability is described in copending commonly assigned U.S. patent application Ser. No. 918,988, filed Jul. 23, 1992, entitled "Aqueous Developer For Lithographic Printing Plates With Improved Desensitizing Capability" by J. E. Walls, G. R. Miller and R. W. Ryan, Jr. and issued Jan. 18, 1994, as U.S. Pat. No. 5,279,927.

The developing composition of application Ser. No. 918,988 is comprised of:

(1) an organic solvent,
(2) an anionic surface active agent,
(3) an alkali metal tetraborate,
(4) an aliphatic monocarboxylic acid, preferably containing 6 to 22 carbon atoms,
(5) an aliphatic dicarboxylic acid, preferably containing 4 to 16 carbon atoms, and
(6) an alkaline buffering system in an amount sufficient to provide an alkaline pH. While this developing composition provides excellent results, and particularly exhibits excellent desensitizing capability, it would be advantageous to improve its ability to enhance the oleophilicity of the image areas of the printing plate and thus bring about improved ink receptivity of the image areas.

It is toward the objective of providing a new and improved aqueous developer, for use with negative-working lithographic printing plates, which has improved desensitizing capability and the ability to provide enhanced oleophilicity to the image areas of the plate that the present invention is directed.

SUMMARY OF THE INVENTION

In accordance with this invention, an aqueous alkaline developing composition which is useful in the development of negative-working lithographic printing plates is comprised of:

(1) an organic solvent,
(2) an anionic surface active agent,
(3) an alkali metal tetraborate,
(4) an aliphatic monocarboxylic acid, preferably containing 6 to 22 carbon atoms,
(5) an aliphatic dicarboxylic acid, preferably containing 4 to 16 carbon atoms,
(6) a long chain aliphatic amine, and
(7) an alkaline buffering system in an amount sufficient to provide an alkaline pH.

The aqueous developer of this invention differs from that of copending patent application Ser. No. 918,988 in that it additionally contains a long chain aliphatic amine which has been unexpectedly found to significantly improve the oleophilicity of the image areas of negative-working lithographic printing plates processed therein.

The aqueous developer of this invention can be employed in the development of any of a wide variety of negative-working lithographic printing plates. Thus, for example, it can be employed with lithographic printing plates containing the acetal polymer binders described in any of U.S. Pat. Nos. 4,652,604, 4,741,985 and 4,940,646. It can be employed with printing plates containing binary acetal polymers as described in copending commonly assigned U.S. patent application Ser. No. 738,067, filed Jul. 30, 1991, "Photosensitive Compositions And Lithographic Printing Plates Containing Binary Acetal Polymers", by John E. Walls and issued Nov. 16, 1993, as U.S. Pat. No. 5,262,270. It can be employed with printing plates containing acid-substituted ternary acetal polymers as described in copending commonly assigned U.S. patent application Ser. No. 738,088, filed Jul. 30, 1991, "Photosensitive Compositions And Lithographic Printing Plates Containing Acid-Substituted Ternary Acetal Polymers", by John E. Walls and Larry D. LeBoeuf and issued Jun. 15, 1993, as U.S. Pat. No. 5,219,699. It is especially advantageous for use with lithographic printing plates comprising both an acid-substituted ternary acetal polymer and an unsaturated polyester as described in copending commonly assigned U.S. patent application Ser. No. 918,868, filed Jul. 23, 1992, "Photosensitive Compositions And Lithographic Printing Plates With Reduced Propensity To Blinding", by John E. Walls and issued Jan. 4, 1994, as U.S. Pat. No. 5,275,907.

The aqueous developer of this invention has many advantageous features. Thus, for example, it requires only a low concentration of organic solvent yet is highly effective in dissolution-type processing. It is highly resistant to oxidation. Most significantly, it is very effective in overcoming the problems of excessive background sensitivity yet is also very effective in enhancing the oleophilicity of the image areas. It is capable of providing a long processing cycle (>15 square meters per liter of developing solution) with essentially no change in the quality of processing, while at the same time offering complete removal of yellow stain on even the most severely stained plates of the composition described in the aforesaid copending commonly assigned U.S. patent application Ser. No. 918,868.

DESCRIPTION OF THE PREFERRED EMBODIMENTS

As indicated hereinabove, the ingredients required in the aqueous alkaline developing composition of this invention are (1) an organic solvent, (2) an anionic surface active agent, (3) an alkali metal tetraborate, (4) an aliphatic monocarboxylic acid, preferably containing 6 to 22 carbon atoms, (5) an aliphatic dicarboxylic acid, preferably containing 4 to 16 carbon atoms, (6) a long chain aliphatic amine, and (7) an alkaline buffering system in an amount sufficient to provide an alkaline pH.

By the term "a long chain aliphatic amine", as employed herein, is meant an aliphatic amine having at least one alkyl group containing at least six carbon atoms attached to the amino nitrogen atom.

The function of the organic solvent is to assist in the removal of the non-exposed portions of the photosensitive coating. Any of a wide variety of solvents can be used, with those typically employed being high boiling liquids. The most preferred solvent is 2-phenoxy propanol due to its excellent solvent action and very low toxicity. Other suitable solvents include, but are not restricted to, 2-phenoxy ethanol, benzyl alcohol, N-methyl pyrrolidone, butyrolactone, propylene glycol monomethyl ether and the like. The organic solvent can be employed in the developing composition in an amount of from about 0.2 to about 16 weight percent, more preferably in an amount of from about 1 to about 10 weight percent, and most preferably in an amount of from about 2.5 to about 7 weight percent.

The anionic surface active agent serves to reduce the surface tension so as to facilitate better penetration of the developer into the coating as well as to provide some cleaning action and dispersion of the coating composition that is removed. Any of a wide variety of anionic surface active agents, especially sulfate and sulfonate alkyl and aryl alkyl anionic surface active agents, can be used. Sodium octyl sulfate is preferred. Other suitable anionic surface active agents include, but are not restricted to, potassium decyl sulfate, sodium toluene sulfonate, sodium xylene sulfonate, sodium dodecylbenzene sulfonate, potassium tridecylbenzene sulfonate, lithium dinonadecylbenzene sulfonate, sodium docosanylbenzene sulfonate, potassium methyl naphthalene sulfonate, lithium triethyl naphthalene sulfonate, sodium isopropyl naphthalene sulfonate, sodium diisopropyl naphthalene sulfonate, sodium dibutyl naphthalene sulfonate, and the like. The anionic surface active agent can be employed in the developing composition in an amount of from about 0.2 to about 15 weight percent, more preferably in an amount of about 0.8 to about 12 weight percent and most preferably in an amount of about 1.2 to about 8 weight percent.

The alkali metal tetraborate serves to elevate the activity of the developing composition, particularly as it relates to the desensitization of the background. Potassium tetraborate is preferred for this purpose but sodium tetraborate and lithium tetraborate are also useful. The alkali metal tetraborate can be employed in the developing composition in an amount of from about 0.01 to about 7 weight percent, more preferably in an amount of about 0.05 to about 5 weight percent, and most preferably in an amount of from about 0.1 to about 3 weight percent.

The function of the aliphatic monocarboxylic acid is to effectively remove diazo resin from the background areas as well as partially insolubilized diazo resin from and around the image area, thereby precluding or at least minimizing the possibility of "hot-spot" formation or halation. Preferred aliphatic monocarboxylic acids for this purpose are those containing 6 to 22 carbon atoms. The most preferred aliphatic monocarboxylic acid is nonanoic acid (also known as pelargonic acid). Other suitable aliphatic monocarboxylic acids include, but are not restricted to, hexanoic acid, octanoic acid, decanoic acid, undecanoic acid, dodecanoic acid, pentadecanoic acid, octadecanoic acid, eicosanoic acid, docosanoic acid, and the like. The aliphatic monocarboxylic acid can be employed in the developing composition in an amount of from about 0.5 to about 12 weight percent, more preferably in an amount of about 1.5 to about 10 weight percent, and most preferably in an amount of about 2.5 to about 8 weight percent.

The function of the aliphatic dicarboxylic acid is to enhance the desensitization of both image and background areas. When both an aliphatic monocarboxylic acid and an aliphatic dicarboxylic acid are incorporated in the developer, the degree to which the background is cleaned is significantly and surprisingly improved in comparison with use of only an aliphatic monocarboxylic acid or only an aliphatic dicarboxylic acid. Preferred aliphatic dicarboxylic acids for this purpose are those containing 4 to 16 carbon atoms. The most preferred aliphatic dicarboxylic acid is sebacic acid. Other suitable aliphatic dicarboxylic acids include, but are not restricted to, succinic acid, glutaric acid, adipic acid, pimelic acid, suberic acid, azelaic acid, dodecanedioic acid, hexadecanedioic acid, and the like. The aliphatic dicarboxylic acid can be employed in the developing composition in an amount of from about 0.05 to about 10 weight percent, more preferably in an amount of about 0.2 to about 5 weight percent, and most preferably in amount of about 0.4 to about 3 weight percent.

The long chain aliphatic amine provides improved removal of coating residuals from the image areas of the plate and also improves the oleophilicity and thus the ink receptivity of the image areas. It can be employed in the developing composition in an amount of from about 0.05 to about 5 weight percent, more preferably in an amount of about 0.1 to about 2 weight percent, and most preferably in an amount of about 0.2 to about 0.8 weight percent.

Useful long chain aliphatic amines for the purpose of this invention include primary, secondary and tertiary aliphatic amines. Specific examples of such amines include:
n-hexyl amine
n-octyl amine
n-decyl amine n-dodecyl amine
n-hexadecyl amine
n-octadecyl amine
di-n-octyl amine
tri-n-octyl amine
N-ethyl-dihexyl amine
N-methyl-dioctyl amine
N-propyl-dioctyl amine
and the like.

Since the developing composition must be alkaline, salts of the acids are employed to formulate the developing composition or are formed in its manufacture. Potassium hydroxide is preferably used to form the potassium salts although sodium and lithium salts are also useful. Potassium carbonate is advantageously employed to provide the desired working pH and to impart buffering capability, but other common buffering agents, such as, for example, trisodium phosphate, disodium phosphate, sodium phthalate, sodium citrate, sodium ascorbate, and sodium tartrate, can be used if desired.

The alkaline buffering system, for example, the combination of potassium hydroxide and potassium carbonate, can be utilized in any amount sufficient to provide an alkaline pH. The pH of the working strength developing composition is preferably in the range of from 8 to 12, more preferably in the range of 8.5 to 11, and most preferably in the range of 9 to 10. Suitable amounts of potassium hydroxide or other alkaline salt-forming agents are in the range of from about 0.1 to about 8 weight percent, more preferably in the range of about 0.05 to about 6 weight percent, and most preferably in the range of about 0.1 to about 3 weight percent. The potassium hydroxide or other alkaline agent, is preferably used only in the mole ratio required to form salts of the carboxylic acids or in just a slight excess over this amount.

In addition to the required ingredients specified above, various optional ingredients can also be included in the developing composition. Examples of such optional ingredients include sodium oxalate and sodium nitrate which are useful as desensitizers. Another useful optional ingredient is an antifoaming agent and particularly useful antifoaming agents are polydimethyl siloxanes such as BURST RSD-10 Antifoam which is commercially available from HYDROLABS Company, Wayne, N.J. The antifoam is preferably used in the developing composition in an amount in the range from about 0.001 to about 3 weight percent, more preferably in the range from about 0.005 to about 1 weight percent, and most preferably in the range of from about 0.01 to about 0.5 weight percent.

As described hereinabove, the aqueous alkaline developing composition of this invention is especially well adapted for use with the lithographic printing plates described in copending commonly assigned U.S. patent application Ser. No. 918,868, filed Jul. 23, 1992, "Photosensitive Compositions And Lithographic Printing Plates With Reduced Propensity To Blinding", by John E. Walls.

The lithographic printing plates of the aforesaid copending patent application Ser. No. 918,868 are comprised of a support having thereon a radiation-sensitive layer comprising a diazo resin, an acid-substituted ternary acetal polymer, and an unsaturated polyester.

The useful diazo resins include, for example, the condensation product of p-diazo diphenyl amine and paraformaldehyde, the condensation product of 3-methoxy-4-diazo diphenylamine and paraformaldehyde, and the diazo resins of U. S. Pat. Nos. 2,063,631, 2,667,415, 2,667,498, 2,922,715, 2,946,683, 3,050,502, 3,163,633, 3,227,074, 3,311,605, 3,406,159, 3,679,419, 3,849,392 and 3,867,147.

The diazo resin is typically employed in an amount of about 20 to about 70 percent by weight of the photosensitive layer, more preferably in an amount of about 30 to about 60 percent by weight, and most preferably in an amount of about 40 to about 55 percent by weight. The acid-substituted ternary acetal polymer is typically employed in an amount of about 20 to about 75 percent by weight of the photosensitive layer, more preferably in an amount of about 30 to about 60 percent by weight, and most preferably in an amount of about 35 to about 50 percent by weight. The unsaturated polyester is typically employed in an amount of from about 5 to about 40 percent by weight of the photosensitive layer, more preferably in an amount of about 8 to about 30 percent by weight, and most preferably in an amount of about 10 to about 20 percent by weight.

The acid-substituted ternary acetal polymers have recurring units represented by the formula:

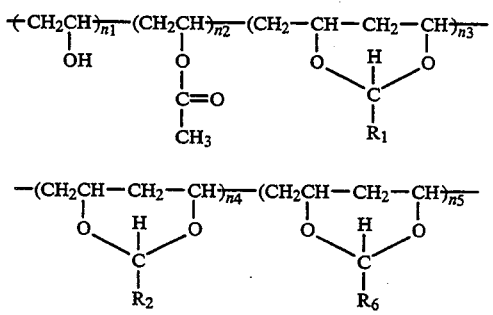

wherein $R_1$ is —H, —$C_nH_{2n+1}$ or —$C_nH_{2n}$—OH

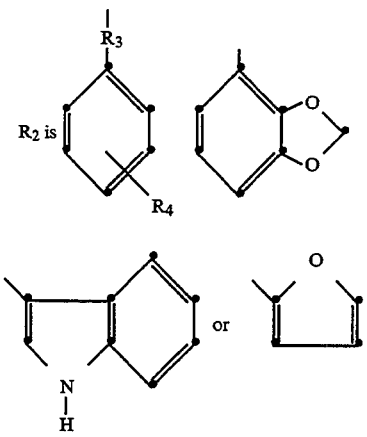

where $R_3$ is —$(CH_2)_x$— or —$(CH_2)_m$—$CH(CH_2)_p$—
                                              |
                                              $(CH_2)_y$
                                              |
                                              $CH_3$ and
x=0–8
m=0–8
y=0–8
p=0–8

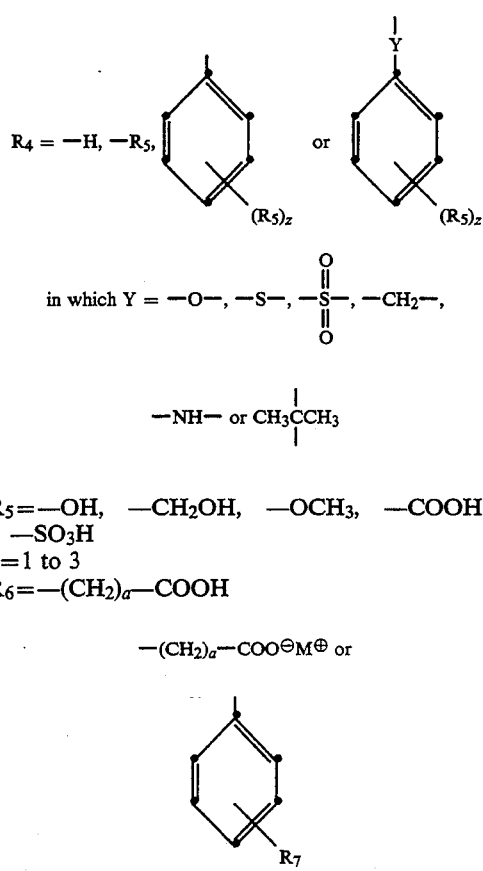

where
R_7 = —COOH, —COO$^\oplus$M$^\ominus$, —(CH$_2$)$_a$COOH, —O—(CH$_2$)$_a$COOH, —SO$_3$H, —SO$_3$$^\oplus$M$^\ominus$, —PO$_3$H$_2$, —PO$_3$$^{61}$M$_2$$^\ominus$ —PO$_4$H$_2$ or —PO$_4$$^\oplus$M$_2$$^\ominus$,
a=0 to 8
M=Na, K, Li or NH$_4$ and
$n_1$=0-25 mole %, preferably 3 to 15 mole %
$n_2$=2-25 mole %, preferably 5 to 15 mole %
$n_3$=10-70 mole %, preferably 15 to 50 mole %
$n_4$=10-60 mole %, preferably 12 to 45 mole %
$n_5$=10-45 mole %, preferably 15 to 30 mole %

As indicated by the above structural formula, the acid-substituted ternary acetal polymers can be tetramers, in which the recurring unit comprises a vinyl acetate moiety and first, second and third cyclic acetal groups, or pentamers in which the recurring unit comprises a vinyl alcohol moiety, a vinyl acetate moiety and first, second, and third cyclic acetal groups.

All three of the acetal groups are six-membered cyclic acetal groups, one of them is unsubstituted or substituted with an alkyl or hydroxyalkyl group, another is substituted with an aromatic or heterocyclic moiety, and a third is substituted with an acid group, an acid-substituted alkyl group or an acid-substituted aryl group.

The acid-substituted ternary acetal polymers can be prepared by hydrolyzing polyvinyl acetate, or by starting with partially hydrolyzed polyvinyl acetate, i.e. polyvinyl alcohol, and reacting it with three different aldehydes to thereby form a ternary acetal. Suitable techniques for forming polymers of this type are known to those skilled in the art. Thus, for example, the ternary acetal polymers can be prepared by an emulsion condensation wherein, as the solubility of the starting material changes from water-soluble to solvent-soluble as a result of the formation of the acetal groups, the product forms an emulsion because of its lack of solubility in water. In this method, the particles are prevented from aggregating by use of a surfactant.

An alternative method is to compensate for the change in solubility of the starting material from water-soluble to solvent-soluble by maintaining a homogeneous solution through the continual addition of an appropriate solvent. In the former process, the precipitated particles are filtered, washed and dried. In the latter process, the reaction solution is added to water and mixed in a blender or homogenizer to precipitate the resin product and create particles of the desired size.

The acetalization is catalyzed by the use of an organic or inorganic acid in an amount that will effectively allow protonation to occur, but will not significantly alter the final product by causing unwanted hydrolysis of the acetal groups.

Examples of suitable aldehydes useful in preparing the first cyclic acetal group of the acid-substituted ternary acetal polymers described herein include:
formaldehyde
acetaldehyde
propionaldehyde
n-butyraldehyde
isobutyraldehyde
4-hydroxybutyraldehyde
n-valeraldehyde
5-hydroxyvaleraldehyde
n-caproaldehyde
n-heptaldehyde
and the like.

Examples of suitable aldehydes useful in preparing the second cyclic acetal group of the acid-substituted ternary acetal polymers described herein include:
2-phenyl propionaldehyde
3-phenyl butyraldehyde
benzaldehyde
2-hydroxy benzaldehyde
4-hydroxy benzaldehyde
2,4-dihydroxy benzaldehyde
cinnamaldehyde
hydrocinnamaldehyde
biphenyl carboxaldehyde
indole carboxaldehyde
salicylaldehyde
piperonal
furfural
and the like.

Examples of suitable aldehydes useful in preparing the third cyclic acetal group of the acid-substituted ternary acetal polymers described herein include:
2-formyl phenoxy acetic acid
glyoxylic acid
semisuccinaldehyde
4-formyl phenoxy acetic acid
2-carboxybenzaldehyde
4-carboxybenzaldehyde
2-formyl phenoxy sulfonic acid
2-formyl phenoxy phosphonic acid
and the like.

An especially preferred acid-substituted ternary acetal polymer for use in this invention comprises about 3 mole % of vinyl alcohol moieties, about 12 mole % of vinyl acetate moieties, about 48 mole % of cyclic acetal moieties derived by reaction with propionaldehyde, about 12 mole % of cyclic acetal moieties derived by reaction with 3-phenyl butyraldehyde, and about 25 mole % of cyclic acetal moieties derived by reaction with 2-formyl phenoxy acetic acid.

Another especially preferred acid-substituted ternary acetal polymer for use in this invention comprises about 7 mole % of vinyl alcohol moieties, about 12 mole % of vinyl acetate moieties, about 17 mole % of cyclic acetal moieties derived by reaction with n-butyraldehyde, about 34 mole % of cyclic acetal moieties derived by reaction with benzaldehyde and about 30 mole % of cyclic acetal moieties derived by reaction with glyoxylic acid.

Polyvinyl alcohols suitable for use as starting materials in preparing the acid-substituted ternary acetal polymers are well known commercially available materials. They preferably have an average molecular weight in the range of from about 3,000 to about 120,000. Examples of suitable polyvinyl alcohols include those available in a range of molecular weights from AIR PRODUCTS CORPORATION under the trademarks AIRVOL 203, AIRVOL 205, AIRVOL 523 and AIRVOL 540. Other suitable polyvinyl alcohols include those available from HOECHST-CELANESE under the trademarks MOWIOL 4-88, MOWIOL 5-88, MOWIOL 18-88, MOWIOL 26-88, and MOWIOL 40-88.

As indicated hereinabove, the radiation-sensitive compositions of this invention include an unsaturated polyester as well as an acid-substituted ternary acetal polymer. The unsaturated polyester employed in this invention is a copolyester of an unsaturated dicarboxylic acid such as fumaric acid or maleic acid, or mixtures thereof, and an oxyalkylene ether of an alkylidene diphenol. A typical example is the copolyester of fumaric acid which has the formula:

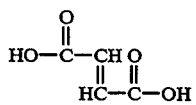

and polyoxypropylene-2,2'-bis(4-hydroxyphenyl)propane which has the formula:

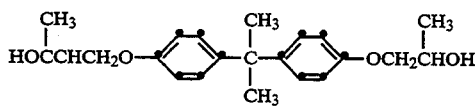

Such copolyesters are well known in the art and are described, for example, in British Patents 722,264, 722,265, 722,266 and 722,273. They are available commercially from Reichhold Chemicals, Inc., as ATLAC 382E BISPHENOL FUMARATE RESIN (also known as ATLAC 32-629-00) and related resins ATLAC 382.05 (a solution of ATLAC 382E in styrene), ATLAC 32-631-000 (also known as ATLAC 382ES), ATLAC 32-628-00 (also known as ATLAC 382A) and ATLAC 32-630-00 (also known as ATLAC 382ESA); from CARGILL INC. as CARGILL 51-5184 resin and CARGILL 74-7451 resin; and from UNION CAMP CORPORATION as UNIREZ 1042 resin.

To prepare the unsaturated polyester, an alkylene oxide, such as propylene oxide, is condensed with an alkylidene diphenol such as bisphenol-A, to give the bis-hydroxyalkyl derivative which, in turn, is reacted with an unsaturated acid, such as fumaric acid, to give the unsaturated polyester.

As described in British Patent No. 722,264, the suitable oxyalkylene ethers of an alkylidene diphenol can be generically represented by the formula:

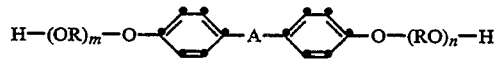

wherein A is a 2-alkylidene radical of 3 or 4 carbon atoms, R is an alkylene radical of 2 or 3 carbon atoms, m and n are each at least one and the sum of m and n is not greater than 3. The esterifying dicarboxylic acid is predominantly fumaric acid, or maleic acid or mixtures thereof, but may include minor proportions of saturated aliphatic acids, aromatic acids or other unsaturated aliphatic acids, such as, for example, succinic acid, sebacic acid, phthalic acid or itaconic acid.

Copolyesters of an unsaturated carboxylic acid and an oxyalkylene ether of an alkylidene diphenol have been found to be especially useful in alleviating problems of blinding that can occur with lithographic printing plates containing an acid-substituted ternary acetal polymer. They provide enhanced properties in this regard without significantly detracting from other important characteristics of the composition. Certain other polymers evaluated were found to also alleviate the blinding problem to some extent but to introduce one or more undesirable features. Examples of such polymers are homoacetals, polyvinyl acetates, epoxies, acrylates and urethanes.

The unsaturated polyesters utilized herein have been employed heretofore in lithographic printing plates, for example, in the printing plates described in U.S. Pat. Nos. 5,045,432, 5,053,315 and 5,061,600 but use thereof in combination with acid-substituted ternary acetal polymers is neither disclosed nor suggested in the prior art.

In addition to a diazo resin, the acid substituted ternary acetal polymer and the unsaturated polyester, the imaging layer of the lithographic printing plate can optionally contain a variety of other ingredients such as colorants, stabilizers, exposure indicators and surfactants. Particularly useful colorants are pigments, including phthalocyanine, anthraquinone and quinacridone pigments. The pigment selected should be one which contains a minimal amount of heavy metal and which forms a stable dispersion with the acid-substituted ternary acetal binder resin. Useful amounts of pigment are from about 1 to about 20 percent by weight of the photosensitive layer, more preferably from about 2 to about 12 percent by weight, and most preferably from about 4 to about 8 percent by weight. Effective stabilizers include both organic and inorganic acids, preferably citric, phosphoric, ascorbic or tartaric acids. Useful amounts of acid are from about 2 to about 6 percent by weight of the photosensitive layer, more preferably from about 2.5 to about 5 percent by weight, and most preferably from about 3 to about 4 percent by weight. Useful exposure indicators are dyes which are pH sensitive and which do not couple with diazonium compounds. Examples of such dyes include eosin, azobenzene, Victoria Blue, 4-phenylazo diphenylamine, methyl violet and phenolphthalein. Useful amounts of the dye are from about 0.01 to about 3 percent by weight of the photosensitive layer, more preferably from about 0.05 to about 2 percent by weight, and most preferably from about 0.1 to about 1 percent by weight. Useful surfactants include fluorocarbon surfactants, such as FC-430 surfactant from 3M Corporation or Zonyl NS surfactant from DuPont, and silicone surfactants such as Silwet L-7606 surfactant from Union Carbide Corporation or BYK surfactant from BYK CHEMIE. The surfactant is used in an amount of from about 0.1 to about 4 percent by weight of the photosensitive layer, more preferably from about 0.5 to about 2.5 percent by weight, and most preferably from about 1 to about 2 percent by weight.

In forming the photosensitive layer, the diazo resin, the acid-substituted ternary acetal polymer, the unsaturated polyester and the optional ingredients are dispersed in a suitable solvent or mixture of solvents. Particularly useful solvents include 2-methoxyethanol and the acetate thereof, 1-methoxy-2-propanol and the acetate thereof, 2-ethoxyethanol and the acetate thereof, toluene, diisobutyl ketone, butyrolactone, N-methyl pyrrolidone, methyl lactate, ethyl acetate, dimethyl formamide, tetrahydrofuran, methylethyl ketone and butyl acetate.

The support for the lithographic printing plate is typically formed of aluminum which has been grained, for example by electrochemical graining, and then anodized, for example, by means of anodizing techniques employing sulfuric acid and/or phosphoric acid. Methods of both graining and anodizing are very well known in the art and need not be further described herein.

The acid-substituted ternary acetal polymers and unsaturated polyesters described herein can be employed in dual layer lithographic printing plates in which a radiation-sensitive layer comprising a photocrosslinkable polymer is coated over a radiation-sensitive layer containing a diazo resin. Photocrosslinkable polymers which are particularly useful for this purpose are those containing the photosensitive group —CH=CH—CO— as an integral part of the polymer backbone, especially the p-phenylene diacrylate polyesters. These polymers are described, for example, in U. S. Pat. Nos. 3,030,208, 3,622,320, 3,702,765 and 3,929,489. A typical example of such a photocrosslinkable polymer is the polyester prepared from diethyl p-phenylenediacrylate and 1,4-bis($\beta$-hydroxyethoxy)cyclohexane, which is comprised of recurring units of the formula:

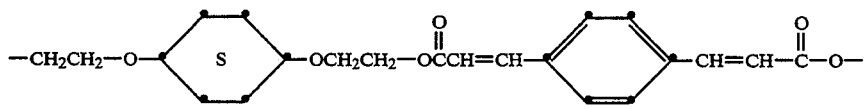

Other particularly useful polymers of this type are those which incorporate ionic moieties derived from monomers such as dimethyl-3,3'-[sodioimino]disulfonyl]dibenzoate and dimethyl-5-sodiosulfoisophthalate. Examples of such polymers include poly[1,4-cyclohexylene-bis(oxyethylene)-p-phenylenediacrylate]-co-3,3'-[(sodioimino)disulfonyl]dibenzoate and poly[1,4-cyclohexylene-bis(oxyethylene)-p-phenylenediacrylate]-co-3,3'-[(sodioimino)disulfonyl]-dibenzoate-co-3-hydroxyisophthalate.

In using the aqueous developing composition described herein, an exposed printing plate is developed by flushing, soaking, swabbing or otherwise treating the crosslinked radiation-sensitive layer. The developing composition selectively solubilizes (i.e., removes) the unexposed areas of the radiation-sensitive layer.

The printing plate can be exposed by any of a wide variety of methods, for example, through a transparency or a stencil, to an imagewise pattern of actinic radiation, preferably rich in ultraviolet light, which crosslinks and insolubilizes the radiation-sensitive polymer in the exposed areas. Suitable light sources include carbon arc lamps, mercury vapor lamps, fluorescent lamps, tungsten filament lamps, "photoflood" lamps, lasers and the like. The exposure can be by contact printing techniques, by lens projection, by reflex, by bireflex, from an image-bearing original or by any other known technique.

The invention is further illustrated by the following examples of its practice.

EXAMPLE 1

A developing composition utilized herein as a control was prepared in accordance with the following formulation:

| Ingredient | Grams |
| --- | --- |
| 2-phenoxy propanol | 49.50 |
| nonanoic acid | 54.00 |
| sebacic acid (94%) | 6.00 |
| potassium hydroxide (90%) | 19.15 |
| sodium hydroxide (50%) | 5.20 |
| sodium octyl sulfate (31%) | 65.00 |
| potassium carbonate (anhydrous) | 7.50 |
| $K_2B_4O_7 \cdot 4H_2O$ | 5.00 |
| BURST RSD-10 Antifoam (10%) | 0.40 |
| water | 788.25 |
| pH = 9.5 | |

A negative-working lithographic printing plate, as described in the aforesaid copending U.S. patent application Ser. No. 918,868, was exposed with a negative mask and developed with the developing composition described above. To prepare the plate, a radiation-sensitive composition, having the formulation indicated below, was coated on the surface of an aluminum support which had been electrochemically grained, anodized and conditioned with a silicate barrier layer.

| Component | Weight % |
| --- | --- |
| Diazo resin[1] | 1.111 |
| $H_3PO_4$ (85%) | 0.106 |
| Butyrolactone | 13.545 |
| 1-Methoxy-2-propanol | 69.346 |
| 4-Phenyl azodiphenylamine | 0.017 |
| Ternary acetal polymer[2] | 0.705 |
| Tetrahydrofuran | 10.957 |
| BYK 306 (10%)[3] | 0.210 |
| Unsaturated polyester[4] | 0.470 |
| Pigment dispersion[5] | 3.533 |
| | 100.000 |

(1) Condensation product of 3-methoxy-4-diazo diphenyl amine sulfate and an isomeric mixture of methoxymethyl substituted diphenyl ethers isolated as the mesitylene sulfonate salt.

(2) Acid-substituted ternary acetal polymer comprising about 2 mole % of vinyl alcohol moieties, about 12 mole % of vinyl acetate moieties, about 48 mole % of cyclic acetal moieties derived by reaction with propionaldehyde, about 12 mole % of cyclic acetal moieties derived by reaction with 3-phenyl butyraldehyde, and about 25 mole % of cyclic acetal moieties derived by reaction with 2-formyl phenoxy acetic acid.

(3) A polyether modified dimethyl polysiloxane surfactant manufactured and sold by BYK CHEMIE.

(4) Copolyester of fumaric acid and polyoxypropylene-2,2'-bis(4-hydroxyphenyl)propane.

(5) The pigment dispersion was prepared by milling 5.3% Hostapern Blue B2G pigment, available from HOECHST-CELANESE Company, and the ternary acetal polymer described in (2) above in a solvent mixture of butyrolactone and 1-methoxy-2-propanol (15:85 w/w).

The same printing plate was also developed with developing compositions A, B, C and D which were identical to the control developing composition except that they additionally contained 0.25, 0.50, 0.75 and 1.00 weight percent of di-n-octylamine. Solutions A, B and C were stirred until the amine was completely dissolved, whereas the higher concentration of amine in solution D could only be dispersed.

The printing plate which was tested had been aged for three months at ambient conditions so that it would be more difficult to process than a fresh coating. The plate was given 110 units of exposure through a KODAK T-14 step wedge and hand processed on newsprint for 45 seconds. The processed plate was rinsed with water and maintained in a vertical position to allow the water to drain from the plate.

The following observations were made and recorded:
(1) cleanout time—the time in seconds required to remove the coating from all non-image areas
(2) solid step—the maximum density step of the T-14 image reproduced on the plate
(3) ghost step—the last visible step of the T-14 image reproduced on the plate
(4) dry time—the time in seconds required for the image to shed water as the plate drains
(5) image color—the color of the image when viewed under sunlight The plates were desensitized with KODAK AQUA-IMAGE PLATE FINISHER MX1540, buffed dry and mounted on a printing press. The printed sheets were evaluated to determine the rate at which the image accepted a full charge of ink. For this evaluation, ink density in a solid image of the eighth printed sheet was measured with a densitometer.

The results obtained are summarized in Table I below.

TABLE I

| Developing Composition | Cleanout Time (seconds) | Solid Step | Ghost Step | Dry Time (seconds) | Image Color | Solid Ink Density |
| --- | --- | --- | --- | --- | --- | --- |
| Control | 19 | 2 | 8 | 30 | slightly green | 0.86 |
| A | 20 | 2 | 8 | 5 | very slightly green | 1.04 |
| B | 18 | 2 | 8 | 6 | very very slightly green | 1.11 |
| C | 17 | 2 | 8 | 5 | almost blue | 1.11 |
| D | 17 | 2 | 9 | 3 | blue | 1.12 |

The results reported above indicate that the addition of di-n-octylamine to the developing composition improves the activity of the composition by removing unexposed light-sensitive diazo resin from the image area of the plate. Since the diazo resin is yellow and the pigment in the coating is blue, a greenish tint indicates that some diazo resin has not been removed. Although the non-image areas of the plate appear very slightly "whiter" when developing compositions containing a long chain aliphatic amine in accordance with this invention are used, this is very difficult to judge visually and traces of unexposed diazo resin in the non-image areas of the plate are decomposed almost immediately in white light. However, since the data in Table I make it evident that the diazo resin is removed more effectively from the image areas, it can be assumed that the same cleansing occurs in the non-image areas as well.

The data reported in Table I also show, by the rate at which the image sheds water and accepts ink, that the image portions of the plate have improved oleophilicity.

EXAMPLE 2

Example 1 was repeated using tri-n-octylamine in place of the di-n-octylamine. Similar results were obtained.

The invention has been described in detail, with particular reference to certain preferred embodiments thereof, but it should be understood that variations and modifications can be effected within the spirit and scope of the invention.

We claim:

1. An aqueous alkaline developing composition that is useful in developing negative-working lithographic printing plates, said composition comprising:
  (1) an organic solvent,
  (2) an anionic surface active agent,
  (3) an alkali metal tetraborate,
  (4) an aliphatic monocarboxylic acid,
  (5) an aliphatic dicarboxylic acid,
  (6) a long chain aliphatic amine, and
  (7) an alkaline buffering system in an amount sufficient to provide a pH in the range of from 8 to 12.

2. A developing composition as claimed in claim 1 wherein said organic solvent is present in an amount of from about 2.5 to about 7 weight percent, said anionic surface active agent is present in an amount of from about 1.2 to about 8 weight percent, said alkali metal tetraborate is present in an amount of from about 0.1 to about 3 weight percent, said aliphatic monocarboxylic acid is present in an amount of from about 2.5 to about 8 weight percent, said aliphatic dicarboxylic acid is present in an amount of from about 0.4 to about 3 weight percent, and said long chain aliphatic amine is present in an amount of from about 0.2 to about 0.8 weight percent, with said weight percent in each case being based on the total weight of said developing composition.

3. A developing composition as claimed in claim 1 wherein the pH is in the range of from 9 to 10.

4. A developing composition as claimed in claim 1 wherein the organic solvent is 2-phenoxypropanol.

5. A developing composition as claimed in claim 1 wherein the organic solvent is N-methyl pyrrolidone.

6. A developing composition as claimed in claim 1 wherein the organic solvent is 2-phenoxyethanol.

7. A developing composition as claimed in claim 1 wherein the organic solvent is benzyl alcohol.

8. A developing composition as claimed in claim 1 wherein the anionic surface active agent is an alkyl sulfate.

9. A developing composition as claimed in claim 1 wherein the anionic surface active agent is an alkyl aryl sulfonate.

10. A developing composition as claimed in claim 1 wherein the anionic surface active agent is sodium octyl sulfate.

11. A developing composition as claimed in claim 1 wherein the anionic surface active agent is potassium decyl sulfate.

12. A developing composition as claimed in claim 1 wherein the anionic surface active agent is sodium xylene sulfonate.

13. A developing composition as claimed in claim 1 wherein the anionic surface active agent is sodium diisopropyl naphthalene sulfonate.

14. A developing composition as claimed in claim 1 wherein the alkali metal tetraborate is potassium tetraborate.

15. A developing composition as claimed in claim 1 wherein the aliphatic monocarboxylic acid contains 6 to 22 carbon atoms.

16. A developing composition as claimed in claim 1 wherein the aliphatic monocarboxylic acid is nonanoic acid.

17. A developing composition as claimed in claim 1 wherein the aliphatic monocarboxylic acid is octanoic acid.

18. A developing composition as claimed in claim 1 wherein the aliphatic monocarboxylic acid is decanoic acid.

19. A developing composition as claimed in claim 1 wherein the aliphatic monocarboxylic acid is dodecanoic acid.

20. A developing composition as claimed in claim 1 wherein the aliphatic dicarboxylic acid contains 4 to 16 carbon atoms.

21. A developing composition as claimed in claim 1 wherein the aliphatic dicarboxylic acid is sebacic acid.

22. A developing composition as claimed in claim 1 wherein the aliphatic dicarboxylic acid is suberic acid.

23. A developing composition as claimed in claim 1 wherein the aliphatic dicarboxylic acid is succinic acid.

24. A developing composition as claimed in claim 1 wherein the long chain aliphatic amine is di-n-octylamine.

25. A developing composition as claimed in claim 1 wherein the long chain aliphatic amine is tri-n-octylamine.

26. A developing composition as claimed in claim 1 wherein said alkaline buffering system comprises potassium hydroxide and potassium carbonate.

27. A developing composition as claimed in claim 1 additionally containing a polydimethyl siloxane antifoaming agent.

28. An aqueous alkaline developing composition that is useful in developing negative-working lithographic printing plates, said composition comprising:
  (1) 2-phenoxypropanol in an amount of from about 2.5 to about 7 weight percent,
  (2) sodium octyl sulfate in an amount of from about 1.2 to about 8 weight percent,
  (3) potassium tetraborate in an amount of from about 0.1 to about 3 weight percent,
  (4) nonanoic acid in an amount of from about 2.5 to about 8 weight percent,
  (5) sebacic acid in an amount of from about 0.4 to about 3 weight percent,
  (6) di-n-octylamine in an amount of from about 0.2 to about 0.8 weight percent, and
  (7) potassium hydroxide and potassium carbonate in an amount sufficient to provide a pH in the range of from 8 to 12, with said weight percent in each case being based on the total weight of said developing composition.

* * * * *